United States Patent
Tay et al.

(10) Patent No.: US 9,236,521 B2
(45) Date of Patent: Jan. 12, 2016

(54) OPTOCOUPLER HAVING LENS LAYER

(71) Applicant: Avago Technologies General IP (Singapore) Pte. Ltd., Singapore (SG)

(72) Inventors: Thiam Siew Tay, Singapore (SG); Premkumar Jeromerajan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 405 days.

(21) Appl. No.: 13/664,297

(22) Filed: Oct. 30, 2012

(65) Prior Publication Data

US 2014/0117383 A1 May 1, 2014

(51) Int. Cl.
*H01L 33/00* (2010.01)
*H01L 31/173* (2006.01)
*H01L 31/0232* (2014.01)

(52) U.S. Cl.
CPC ........ *H01L 31/173* (2013.01); *H01L 31/02327* (2013.01); *H01L 2224/48091* (2013.01); *H01L 2224/48247* (2013.01)

(58) Field of Classification Search
CPC .................. H01L 25/0753; H01L 2924/12041; H01L 23/495; H01L 25/167; H01L 33/52
USPC ............................................. 257/82, E33.076
See application file for complete search history.

(56) References Cited

U.S. PATENT DOCUMENTS

| 4,160,308 | A | * | 7/1979 | Courtney et al. ................ 438/25 |
| 5,148,243 | A | * | 9/1992 | Merrick et al. ................. 257/81 |
| 5,665,983 | A | * | 9/1997 | Nagano .......................... 257/81 |
| 8,073,337 | B2 | | 12/2011 | Arahira |
| 2006/0024851 | A1 | * | 2/2006 | Auburger ............ H01L 31/0203 438/15 |
| 2007/0096136 | A1 | * | 5/2007 | Sun ................................. 257/99 |
| 2008/0191301 | A1 | * | 8/2008 | Noda et al. .................... 257/432 |
| 2009/0059987 | A1 | | 3/2009 | Walker |
| 2009/0156918 | A1 | * | 6/2009 | Davis et al. .................... 600/342 |
| 2010/0007944 | A1 | | 1/2010 | Tanaka |
| 2010/0258712 | A1 | * | 10/2010 | Wiese et al. .............. 250/237 R |
| 2011/0043871 | A1 | * | 2/2011 | Okawa et al. ................. 358/474 |
| 2011/0081112 | A1 | | 4/2011 | Nakagawa |
| 2013/0019459 | A1 | * | 1/2013 | Lim et al. ..................... 29/592.1 |

FOREIGN PATENT DOCUMENTS

JP 2006047812 2/2006

* cited by examiner

*Primary Examiner* — Duy T Nguyen

(57) ABSTRACT

An optocoupler having optical lens layer is disclosed. The optocoupler may comprise an optical emitter, an optical receiver, an isolation layer, a lens layer and a substantially transparent encapsulant. The lens layer may be integrally formed within the optical receiver. Alternatively, the lens layer may be formed integrally with the isolation layer, or the lens layer may be an optical film attached on the optical receiver. The substantially transparent encapsulant may encapsulate at least partially the optical emitter, the optical receiver and the isolation layer. The isolation layer may be inserted to the substantially transparent encapsulant, making the substantially transparent encapsulant into two compartments. In another embodiment, an electronic system having optocoupler is disclosed.

12 Claims, 4 Drawing Sheets

OPTOCOUPLER HAVING LENS LAYER

BACKGROUND

A galvanic isolator provides a means for moving a signal from one electrical circuit to another electrical circuit in a control system when the two electrical circuits should otherwise be electrically isolated from one another. Usually the two electrical circuits operate at different voltages, and thus, should be electrically isolated. For example, consider an application in which a 5V battery powered controller board is configured to control a motor circuit operating at 240V. In this example, the 240V motor circuits should be electrically isolated from the 5V controller circuit, while permitting the 5V controller circuit to send or receive signals from the 240V motor circuit. In this type of application, an isolator may be used to provide voltage and noise isolation, while permitting the information exchange between the two circuit systems. Opto-isolator, also known as optocoupler, is one of the most commonly used galvanic isolators.

Generally, an optocoupler comprises an optical emitter and an optical receiver. The light emitted by the optical emitter may be transmitted to the optical receiver either via reflection, or directly from the optical emitter to the optical receiver. A portion, or more specifically a photo-detector portion of the optical receiver may be configured to receive the emitted light. In order to obtain the highest efficiency, it may be desirable to channel as much light as possible from the optical emitter to the photo-detector.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose to assist understanding and may not be drawn per actual scale.

DETAILED DESCRIPTION

Figure 1:
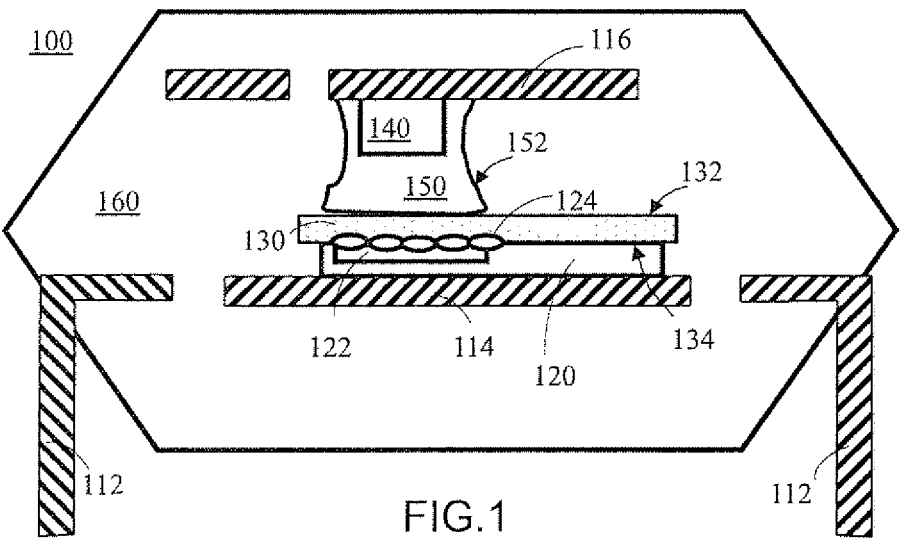
FIG. 1 illustrates a cross-sectional view of an optocoupler having a lens layer integrated onto the optical receiver.

FIG. 1 illustrates an embodiment of a cross-sectional view of an optocoupler 100. The optocoupler 100 may be an electronic device in a lead frame package. However, the discussion hereinafter regarding the optocoupler device 100 in lead frame package may be applicable to other types of optocoupler package or optocoupler assemblies. The optocoupler 100 may comprise a plurality of conductors 112, an isolation layer 130, an optical emitter 140 and an optical receiver 120. The plurality of conductors 112 may be made from conductive material and may be formed from a lead frame. The plurality of conductors 112 may be also referred to as leads or conductive traces. The plurality of conductors 112 may be formed form a lead frame (not shown) being interconnected in an initial stage of the manufacturing process.

The conductors 112 may be extended to form conductive pads 114, 116. The conductive pads 114, 116 may be also referred to as die attach pads. As shown in FIG. 1, the conductive pads 114, 116 may be configured to face each other. The conductive pads 116, 114 may be configured to hold the optical emitter 140 and optical receiver 120. The plurality of conductors 112 may be configured to connect the optical receiver 120 and the optical emitter 140 to external circuitry (not shown). For example, the plurality of conductors 112 may be extended to an edge or bottom of the optocoupler 100, in order to serve as electrical contacts to external circuitry (not shown).

The optical emitter 140 may be a light emitting diode (referred hereinafter as LED) or any light source capable of emitting light. The terms "light" and "optical" as used herein may be visible and/or invisible. All possible variations of electromagnetic waves should be taken into consideration when a specific type of light or radiation or optical emitter or optical receiver or optical signal is discussed, unless explicitly expressed otherwise. For example, ultra-violet, infrared and other invisible radiation should be included when considering the term "light" or optical as used herein, even though light may often be used in the art to refer to radiation that is visible to the human eye.

The optical emitter 140 may comprise an integrated circuit with an embedded LED and driver circuit. Depending on design requirements, control circuitry may be integrated into the optical emitter 140. The optical emitter 140 may be configured to draw power from a first power supply (not shown) using one of the conductors 112. The optical emitter 140 may be operable to emit light in accordance with a logic signal from an external circuit (not shown) operating on the first power supply (not shown). For example, a logic signal "HIGH" may be transmitted to the optical emitter 140 through one of the conductors 112. The optical emitter 140 may, in response, emit light output indicating the "HIGH" signal.

The optical receiver 120 may comprise a photo-detector 122, such as a photo-diode, a phototransistor or other similar devices capable of converting light into electrical signals. The optical receiver 120 may comprise an integrated circuit with an embedded photo-detector 122, and/or may comprise an amplifier circuit (not shown) to amplify photocurrent generated by the photo-detector 122. Depending on design requirements, control circuitry may be integrated into the optical receiver 120 to provide signal processing. The optical receiver 120 may be configured to draw power from a second power supply (not shown) through another one of the conductors 112. The optical receiver 120 may be operable to receive a signal in the form of light emitted from the optical emitter 140.

In FIG. 1, although the optical emitter 140 may be distanced away from the optical receiver 120, it may be desirable to avoid substantially coupling electrical noise from the optical emitter 140 to the optical receiver 120 or from the optical receiver 120 to the optical emitter 140. The isolation layer 130 may provide electrical isolation between the optical emitter 140 from the optical receiver 120. The isolation layer 130 may be flexible in some cases but generally the isolation layer 130 in a non-flexible tape form may be desired. In one embodiment, the isolation layer 130 may be a polyimide tape or a Kapton Tape. The isolation layer 130 may be an electrical insulation layer configured to electrically insulate the optical receiver 120 from the optical emitter 140. The isolation layer 130 may be a layer of glass, a polyimide, or similar electrically insulating materials. The isolation layer 130 may be substantially transparent to the "light", allowing optical signals to be transmitted through.

The isolation layer 130 may be a flat surface having a top surface 132 and a bottom surface 134. The isolation layer 130 may or may not have substantial adhesive properties. In the embodiment shown in FIG. 1, the isolation layer 130 may be glued on to the optical receiver 120 such that the bottom surface 134 may be in direct contact with the optical receiver 120. As shown in FIG. 1, the isolation layer 130 may extend and may entirely cover the optical receiver 120. In another embodiment, the isolation layer 130 may not be required to cover the entire optical receiver 120 but may merely cover enough to block electrical flux from substantially interfering between the optical emitter 140 and the optical receiver 120.

The isolation layer 130, the optical emitter 140 and the optical receiver 120 may be encapsulated by a substantially transparent encapsulant 150, such as clear epoxy, silicone or other similar materials to form a light guide. The substantially transparent encapsulant 150 may encapsulate the entire isolation layer 130, the entire optical emitter 140, and the entire optical receiver 120. Alternatively, the substantially transparent encapsulant 150 may encapsulate a portion of the isolation layer 130, a portion of the optical emitter 140, and/or a portion of the entire optical receiver 120.

The substantially transparent encapsulant 150 may be configured to form the light guide for transmitting the light emitted from the optical emitter 140 to the optical receiver 120. The substantially transparent encapsulant 150 may be formed by dispensing an encapsulant in liquid form to encapsulate both the optical emitter 140 and the optical receiver 120. The liquid form of the substantially transparent encapsulant 150 may be then be cured into a solid, forming the light guide 150. Size of the light guide 150 may be controlled by controlling an amount of the liquid encapsulant dispensed. Optionally, the substantially transparent encapsulant 150 may be additionally encapsulated by an opaque encapsulant 160. The opaque encapsulant 160 may be plastic, ceramic, or any other substantially opaque or black compound, which may be used to form the body of a packaging.

The shape of the substantially transparent encapsulant 150 may depend at least in part upon the viscosity of the liquid encapsulant. Ideally, all of the side surfaces 152 of the substantially transparent encapsulant 150 may be shaped to direct light towards the optical receiver 120. However, this may incur further cost and additional manufacturing steps may be needed. For example, as shown in the embodiment shown in FIG. 1, due to the close proximity of the optical emitter 140 and the optical receiver 120, and the fact that the optical emitter 140 may be positioned opposite the optical receiver 120, it may be difficult to mold the substantially transparent encapsulant 150 in a desired optimum shape.

However, in some cases even the shape of the light guide 150 may not be perfectly formed to transmit light with perfect efficiency In such case, some but not all of the light emitted by the optical emitter 140 may eventually reach the optical receiver 120. Light loss may occur every time the light is being reflected, but the light loss may be small. In order to facilitate the reception of light into the photo-detector 122, a layer of optical lens layer 124 may be formed above the photo-detector 122 of the optical receiver 120. The optical lens layer 124 may be configured to direct light falling on the optical lens layer 124 toward the photo-detector 122.

The optical receiver 120, the photo-detector 122 and the optical lens layer 124 may be integrated into a monolithic single semiconductor die. The refractive index of a passivation layer of the semiconductor die making may be approximately 1.5 whereas the refractive index of the isolation layer 130 (which may comprise polyimide) may be approximately between 1.7 and 2. As the refractive indexes may be different, the optical lens layer 124 may comprise the passivation layer of the semiconductor die of the optical receiver 120. The passivation layer of the semiconductor die of the optical receiver 120 may be shaped and/or configured to form one or more lenses. The passivation layer may be shaped through an etching process to a desired shape.

The optical lens layer 124 may be configured to cover the photo-detector 122 and not the entire optical receiver 120 because light falling onto the optical receiver 120 outside the photo-detector 122 may not be detected by the photo-detector 122. Optionally, the portion of the optical receiver 120 outside the photo-detector 122 may be covered by a layer of metal (not shown) so that light falling on the portion may be reflected back to the substantially transparent encapsulant 150. The layer of metal (not shown) may also function as a protection shield.

Figure 2:
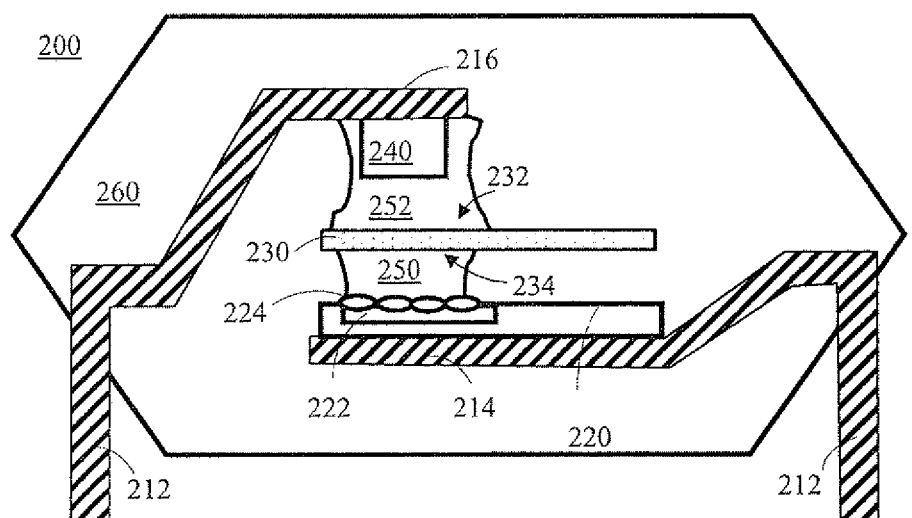
FIG. 2 illustrates a cross-sectional view of an optocoupler having an isolation layer distanced from the optical receiver.

FIG. 2 illustrates a cross-sectional view of another embodiment of an optocoupler 200. The optocoupler 200 may comprise a plurality of conductors 212, an optical receiver 220, an isolation layer 230, an optical emitter 240, a first substantially transparent encapsulant 250, a second substantially transparent encapsulant 252 and an opaque encapsulant 260. The optical receiver 220 may comprise a layer of one or more lenses 224 and a photo-detector 222 located beneath the layer of lens 224. The plurality of conductors 212 may be bent and shaped to form a first die attach pad 214 and a second die attach pad 216 such that the first and second die attach pads 214, 216 are substantially facing each other as shown in FIG. 2.

The first substantially transparent encapsulant 250 may be configured to encapsulate at least a portion of the optical receiver 220 whereas the second substantially transparent encapsulant 252 may be configured to encapsulate at least a portion of the optical emitter 240. In another embodiment, the first and second substantially transparent encapsulant 250, 252 may be configured to encapsulate entirely the optical receiver 220 and optical emitter 240 respectively. The isolation layer 230 may be substantially flat and may comprise a first major surface 232 and a second major surface 234. The first and second major surfaces 232, 234 may be flat. The first major surface 232 may be in direct contact with the second substantially transparent encapsulant 252 whereas the second major surface 234 may be in direct contact with the first substantially transparent encapsulant 250. In other words, as shown in FIG. 2, the isolation layer 230 may be configured to separate the substantially transparent encapsulant 250, 252 into first and second compartments 250, 252.

The structure explained above may be related closely with manufacturing process. For example, the optical emitter 240 and the optical receiver 220 may be first attached to the die attach pads 216, 214 respectively. After wire bonding process, the optical emitter 240 and the optical receiver 220 may be encapsulated by one substantially transparent encapsulant 250. However, before being cured into the solid form, the isolation layer 230 may be inserted into the substantially transparent encapsulant 250 defining therein the first and second substantially transparent encapsulant or compartments 250, 252.

Alternatively, the first and second substantially transparent encapsulant 250, 252 may be formed separately encapsulating the optical receiver 220 and the optical emitter 240 respectively. Before curing into solid form, the isolation layer 230 may be attached to one of the first and second substantially transparent encapsulant 250, 252, followed by further bending the plurality of conductors 212 such that the first substantially transparent encapsulant 250, the isolation layer 230 and the second substantially transparent encapsulant 252 may be in direct contact with one another. The opaque encapsulant 260 may be configured to encapsulate the conductors 112, the die attach pads 214, 216, the substantially transparent encapsulant 250 and/or the isolation layer 230. This may secure the isolation layer 230 at its position.

Figure 3:
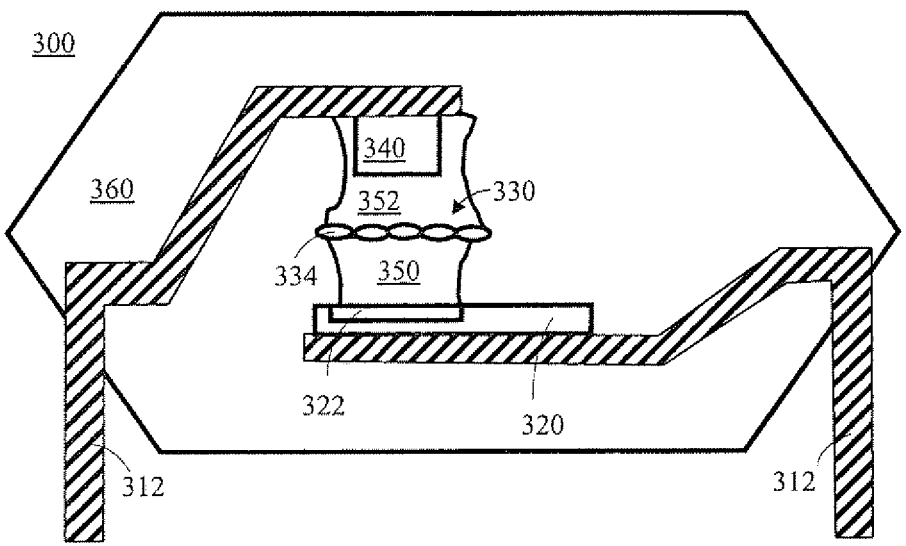
FIG. 3 illustrates a cross-sectional view of an optocoupler having an isolation layer with integral lens functionality.

FIG. 3 illustrates a cross-sectional view of another embodiment of an optocoupler 300. The optocoupler 300 may comprise a plurality of conductors 312, an optical receiver 320, an isolation layer 330, an optical emitter 340, a first substantially transparent encapsulant 350, a second substantially transparent encapsulant 352 and an opaque encapsulant 360. The isolation layer 330 may comprise lenses for directing light towards the photo-detector 322 because the isolation layer 330 may be hot stamped or printed with lens shape forming a plurality of lens 334. For example, polyimide can be hot stamped or printed with the lens shape to form the plurality of lenses 334 of the isolation layer 330. Accordingly, the isolation layer 330 may be formed integrally with the lens layer 334 as shown in FIG. 3.

Figure 4:
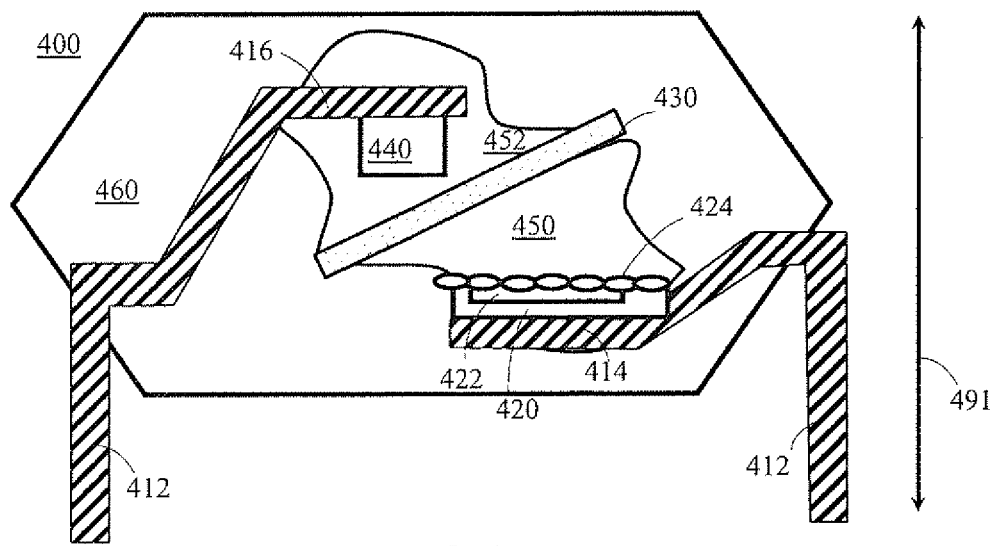
FIG. 4 illustrates a cross-sectional view of an optocoupler having an optical emitter located diagonally opposite a optical receiver.

FIG. 4 illustrates a cross-sectional view of another embodiment of an optocoupler 400. The optocoupler 400 may comprise a plurality of conductors 412, die attach pads 414, 416, an optical receiver 420, an isolation layer 430, an optical emitter 440, a first substantially transparent encapsulant 450, a second substantially transparent encapsulant 452 and an opaque encapsulant 460. The optical emitter 440 and the optical receiver 420 may be positioned substantially diagonally facing each other as shown in FIG. 4. This arrangement may be advantageous over the arrangement shown in previously discussed embodiments when vertical space may be too limited or the height 491 of the optocoupler 400 may be limited.

In addition, the optocoupler 400 may comprise a lens layer 424 made from one or more optical films and being disposed on the optical receiver 420. The lens layer 424 may comprise an optical film made form polycarbonate or other material used in optical films having micro-lens. The lens layer 424 may be glued on to the optical receiver 420. Ideally, the lens layer 424 may cover only the photodiode 422. However, to ease any alignment requirement between the lens layer 424 and the optical receiver 420, it may be desirable to opt for the lens layer 424 covering the entire optical receiver 420.

Figure 5:
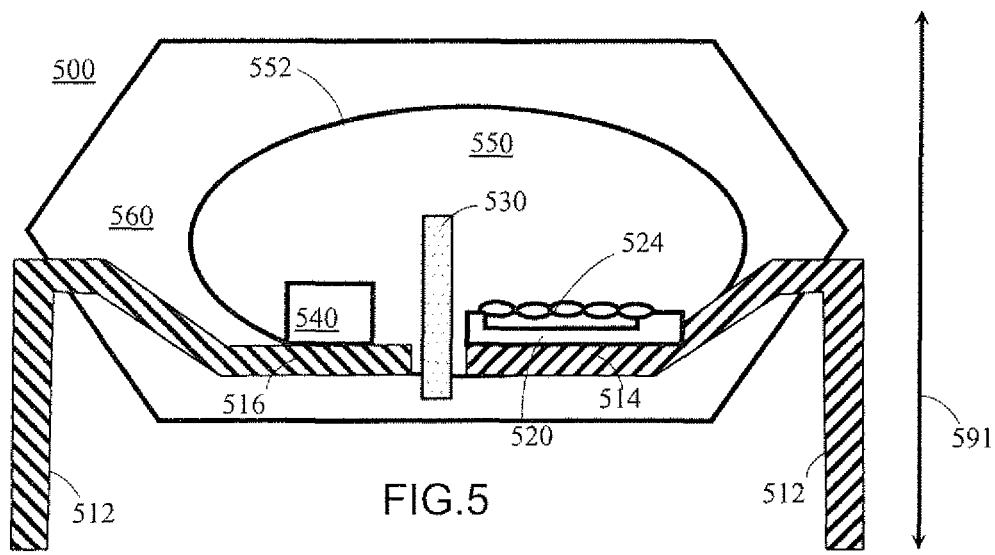
FIG. 5 illustrates a cross-sectional view of an optocoupler having an optical emitter and a optical receiver located side-by-side.

FIG. 5 illustrates a cross-sectional view of another embodiment of an optocoupler 500. The optocoupler 500 may comprise a plurality of conductors 512, die attach pads 514, 516, an optical receiver 520, an isolation layer 530, an optical emitter 540, a substantially transparent encapsulant 550 and an opaque encapsulant 560. The optical emitter 540 and the optical receiver 520 may be positioned substantially side-by-side as shown in FIG. 5. This arrangement may yield an optocoupler 500 having a substantially limited height dimension 591.

The substantially transparent encapsulant 550 may be configured to form a dome shape configured to transmit light. A surface 552 of the substantially transparent encapsulant 550 may be made a substantially reflective surface 552 to substantially limit light loss. The isolation layer 530 may be positioned vertically as shown in FIG. 5. A major surface of the isolation layer 530 may be arranged substantially perpendicular to a major surface of the optical receiver 520 as shown in FIG. 5. After die attach and wire bond, the substantially transparent encapsulant 550 may be formed. The substantially transparent encapsulant 550 may not be in liquid form but a class B semi-liquid form. Before curing the substantially transparent encapsulant 550 into solid form, the isolation tape or the isolation layer 530 may be inserted. The optical receiver 520 may comprise an integrated lens layer 524 on the passivation layer or with an optical film having lens layer 524 glued to the optical receiver 520 as discussed previously.

Figure 6:
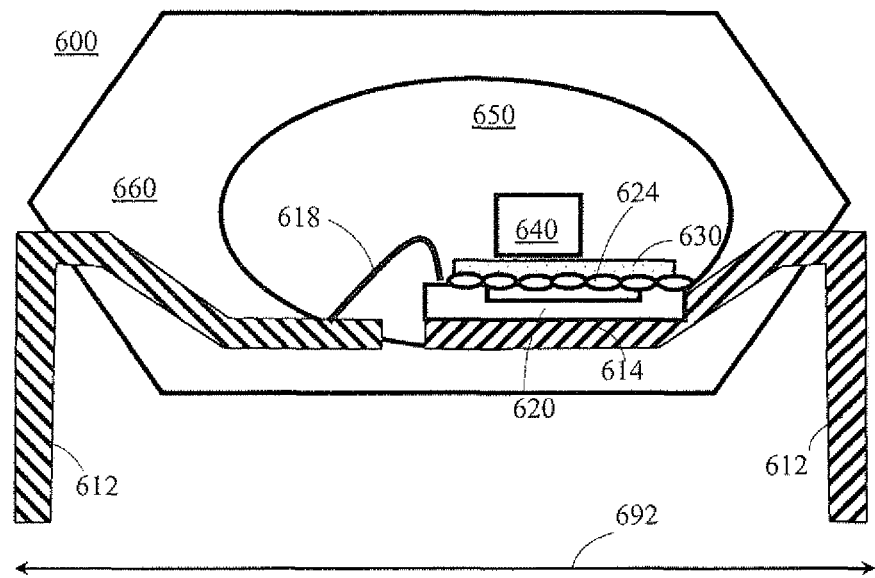
FIG. 6 illustrates a cross-sectional view of an optocoupler having an optical emitter stacked on a optical receiver.

FIG. 6 illustrates a cross-sectional view of another embodiment of an optocoupler 600. The optocoupler 600 may comprise a plurality of conductors 612, die attach pads 614, 616, a wire bond 618, an optical receiver 620, an isolation layer 630, an optical emitter 640, a substantially transparent encapsulant 650 and an opaque encapsulant 660. The optical emitter 640 may be stacked on the optical receiver 620 as shown in FIG. 6. However, as the optical emitter 640 may be required to be electrically isolated from the optical receiver 620, the isolation layer 630 may be disposed between the optical emitter 640 and the optical receiver 620. In the embodiment shown in FIG. 6, a lens layer 624 made from an optical film may be first attached on the optical receiver 620. The isolation layer 630 may be glued on the lens layer 624. The optical emitter 640 may be attached on the isolation layer 630.

Alternatively, the lens layer 624 may be glued on top of the isolation layer 630, which may in turn be glued on the optical receiver 620. The optical emitter 640 may be glued on the lens layer 624. Similarly, the lens layer 624 may be integrated into the optical receiver 620 and may be formed by passivation layer (not shown) of the optical receiver 620. The arrangement of stacking the optical receiver 620 and the optical emitter 640 shown in FIG. 6 may yield an optocoupler with a substantially limited width dimension 692.

Figure 7:
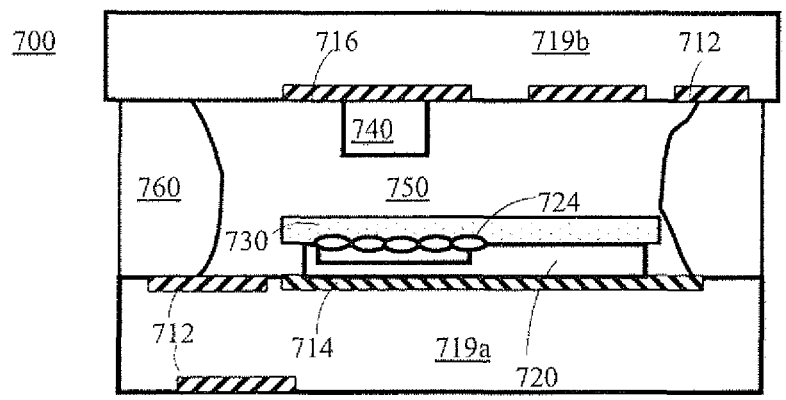
FIG. 7 illustrates a cross-sectional view of an optocoupler having an optical emitter and a optical receiver attached on a Printed Circuit Board substrate.

FIG. 7 illustrates a cross-sectional view of another embodiment of an optocoupler 700 made from printed circuit board (referred hereinafter as "PCB"). The optocoupler 700 may comprise a first substrate 719*a*, a second substrate 719*b*, a plurality of traces 712, die attach pads 714, 716, an optical receiver 720, an isolation layer 730, an optical emitter 740, a substantially transparent encapsulant 750 and an opaque encapsulant 760. The first and second substrates 719*a*, 719*b* of the PCB may comprise a plurality of conductors usually in the form of electrical traces 712 and the die attach pads 714, 716.

Regarding the manufacturing steps, first, the optical emitter 740 and the optical receiver 720 may be attached to the die attach pads 716, 714 respectively. Next, the isolation layer 730 and the lens layer 724 may be glued on the optical receiver 720. Then, the substrates 719*a*, 719*b* may be placed such that the surfaces having the optical emitter 740 and the optical receiver 720 are facing each other. Thereafter, the substantially transparent encapsulant 750 may be dispensed to encapsulate the optical emitter 740 and the optical receiver 720.

Figure 8:
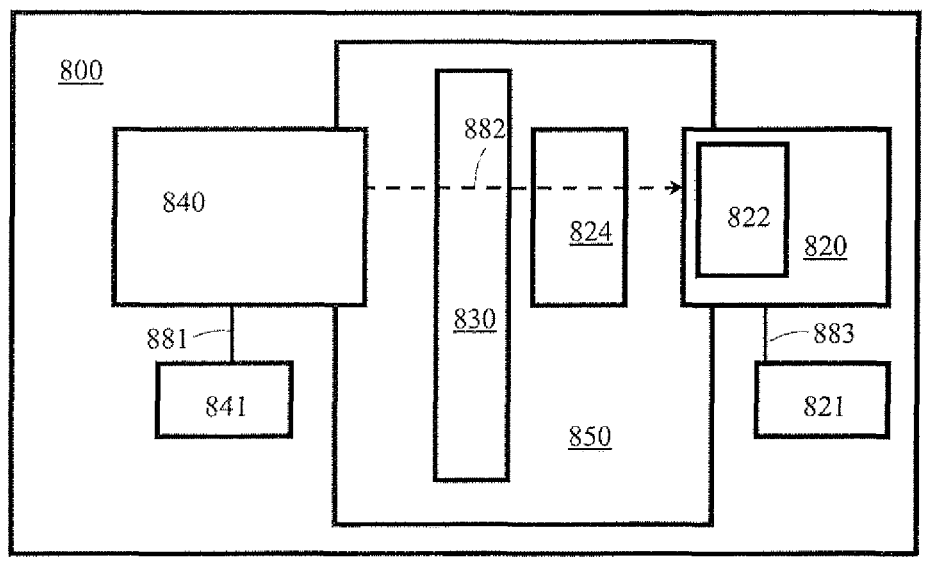
FIG. 8 illustrates an electronic system.

FIG. 8 illustrates a block diagram of an electrical control system 800. The electrical control system 800 may comprise a first circuit 841, a second circuit 821, an optical emitter 840, an optical receiver 820, a substantially transparent encapsulant 850, an isolation layer 830 and a lens layer 824. The first circuit 841 may be configured to control a first system (not shown) whereas the second circuit 821 may be configured to control a second system (not shown).

For example, the electrical control system 800 may be configured to control a robot arm and/or machinery operating in different power domains, which may be used in automobile assembly line. A first circuit 841 may be configured to control a first robot arm, which may be used to assemble a windshield, whereas the second circuit 821 may be a configured to control a second robot arm, which may be used to assemble the body of the automobile. As the first and second control circuits 841, 821 may be electrically isolated, the communication between the first and second control circuits 841, 821 may be accomplished through optical signals. The optical emitter 840 may be configured to convert an electrical signal 881 from the first circuit 841 into an optical signal 882. The photo-detector 822 of the optical receiver 820 may be configured to convert the optical signal 882 back into an electrical signal 883 to the second circuit 821.

Usually, the first and second circuits 841, 821 may draw power from different power supplies (not shown). For example, the first circuit 841 and the optical emitter 840 may draw power from a first power supply (not shown) whereas the second circuit 821 and the optical receiver 820 may draw power from a second power supply (not shown). The voltage level of the first and second power supplies (not shown) may be different. In some cases, the first and second circuits 841, 821 may be of the same voltage level but may be electrically isolated for other reasons. For example, one of the reasons may be that the first power supply (not shown) may have too much noise for the second power supply (not shown).

As shown in FIG. 8, the optical emitter 840 may be electrically coupled to the first circuit 841 whereas the optical receiver 820 may be electrically coupled to the second circuit 821. The lens layer 824 may be optically coupled between the optical emitter 840 and the optical receiver 820. The lens layer 824 may be attached to the optical receiver 820. The isolation layer 830 may be disposed between the first and second circuits 841, 821 and may be configured to electrically insulate the optical emitter 840 from the optical receiver 820.

The isolation layer 830 may be coupled, and/or may be attached to the optical receiver 820. The optical receiver 820 may be substantially larger than the isolation layer 830. The isolation layer 830 may be encapsulated between the substantially transparent encapsulant 850, either partially or completely without being in direct contact with the optical receiver 820 or the optical emitter 840. For example, as shown in the embodiment in FIG. 2, the isolation layer 830 may have two major surfaces, which may be in direct contact with the substantially transparent encapsulant 850. The substantially transparent encapsulant 850 may be configured to encapsulate a portion of the optical emitter 840 and the optical receiver 820, and to encapsulate substantially the isolation layer 830 and the lens layer 824. The substantially transparent encapsulant 850 may function as a light guide for transmitting light from the optical emitter 840 to the optical receiver 820.

Different aspects, embodiments or implementations may, but need not, yield one or more of the following advantages. For example, the arrangement of the optical emitter and the optical receiver may yield substantially limited or reduced or shorter height and/or width dimensions. The size of the isolation layer may also have advantages in the control of the manufacturing process such as alignment accuracy.

Although specific embodiments of the invention have been described and illustrated, the invention is not to be limited to the specific forms or arrangements of parts so described and illustrated. It is to be understood that the illustration and description shall not be interpreted narrowly. For example, the optical emitter may be an LED, but may also be a die with an integrated LED and circuitry or a light source using future technologies. Similarly, although optocoupler is illustrated in all embodiments, it is understood by the person having ordinary skill in the art that the invention may be applicable to the packaging of any other optical devices having at least an optical emitter and an optical receiver encapsulated in a common light guide. The scope of the invention is to be defined by the claims appended hereto and their equivalents.

What is claimed is:

1. An optocoupler, comprising:
   an optical emitter that emits a radiation;
   a optical receiver that receives the radiation emitted by the optical emitter;
   a lens layer optically coupled to the optical emitter and the optical receiver;
   an isolation tape disposed between the optical emitter and the optical receiver for electrically insulating the optical emitter from the optical receiver, wherein the isolation tape is also substantially transparent to the radiation emitted by the optical emitter; and
   a substantially transparent encapsulant encapsulating the optical emitter, at least a portion of the optical receiver, at least a portion of the lens layer and at least a portion of the isolation tape respectively, wherein the lens layer is disposed directly on the optical receiver, the isolation tape is disposed directly on the lens layer, and the optical emitter is disposed on the isolation tape.

2. The optocoupler of claim 1, wherein the optical emitter is distanced from the optical receiver.

3. The optocoupler of claim 1, wherein the optical receiver has a passivation layer, and wherein the passivation layer comprises the lens layer.

4. The optocoupler of claim 1, wherein the isolation tape is glued onto the optical receiver.

5. The optocoupler of claim 1, wherein the isolation tape is disposed within the substantially transparent encapsulant.

6. An optical assembly, comprising:
   a first die pad;
   a second die pad;
   an optical emitter mounted on the first die pad;
   a optical receiver mounted on the second die pad;
   a lens layer optically coupled to the optical receiver;
   an isolation layer positioned between the lens layer and the optical emitter for electrically insulating the optical emitter and the optical receiver, wherein the isolation layer is also substantially transparent to light emitted by the optical emitter; and
   a substantially transparent encapsulant encapsulating the optical emitter, at least a portion of the optical receiver, at least a portion of the lens layer, at least a portion of the isolation layer, and at least a portion of the first and second die pads respectively, wherein the lens layer is disposed directly on the optical receiver, the isolation layer is disposed directly on the lens layer, and the optical emitter is disposed on the isolation layer.

7. The optical assembly of claim 6 further comprising an opaque encapsulant encapsulating the substantially transparent encapsulant.

8. The optical assembly of claim 6, wherein the isolation layer is a substantially thin flat film surrounded by the substantially transparent encapsulant.

9. An electronic control system, comprising:
   a first circuit;
   a second circuit electrically isolated from the first circuit;
   an optical emitter electrically coupled to the first circuit;
   a optical receiver electrically coupled to the second circuit;
   a lens layer optically coupled between the optical emitter and the optical receiver;
   an isolation layer disposed between the first and second circuits for electrically insulating the optical emitter from the optical receiver, wherein the isolation layer is also substantially transparent to light emitted by the optical emitter; and a substantially transparent encapsulant that at least partially encapsulates the optical emitter, the optical receiver, the lens layer, and the isolation layer;

wherein the optical emitter emits an optical signal that is to be transmitted through the lens layer to the optical receiver;

wherein a signal from the first circuit is transmitted to the second circuit via the optical signal; and wherein the lens layer is disposed directly on the optical receiver, the isolation layer is disposed directly on the lens layer, and the optical emitter is disposed on the isolation layer.

10. The electronic control system of claim 9 further comprising an opaque encapsulant completely encapsulating the substantially transparent encapsulant.

11. The electronic control system of claim 9, wherein the substantially transparent encapsulant is configured to encapsulate a portion of the optical emitter and the optical receiver and to encapsulate substantially all of the isolation layer and the lens layer.

12. The electronic control system of claim 9, wherein the isolation layer is a substantially thin flat film surrounded by the substantially transparent encapsulant.

* * * * *